(12) United States Patent
Schneider et al.

(10) Patent No.: US 7,474,100 B2
(45) Date of Patent: Jan. 6, 2009

(54) AUTOMATIC DIGITAL PREEMPHASIS FOR DYNAMIC NMR-MAGNETIC FIELDS BY MEANS OF A DIGITAL IIR FILTER

(75) Inventors: Frank Schneider, Karlsruhe (DE); Birk Schütz, Ettlingen (DE)

(73) Assignee: Bruker Biospin GmbH, Rheinstetten (DE)

( * ) Notice: Subject to any disclaimer, the term of this patent is extended or adjusted under 35 U.S.C. 154(b) by 45 days.

(21) Appl. No.: 11/648,584

(22) Filed: Jan. 3, 2007

(65) Prior Publication Data

US 2007/0159168 A1 Jul. 12, 2007

(30) Foreign Application Priority Data

Jan. 10, 2006 (DE) .................. 10 2006 001 194

(51) Int. Cl.
*G01V 3/00* (2006.01)

(52) U.S. Cl. ..................... 324/322; 324/318

(58) Field of Classification Search ............. 324/318, 324/322

See application file for complete search history.

(56) References Cited

U.S. PATENT DOCUMENTS

| | | | |
|---|---|---|---|
| 4,585,995 A | 4/1986 | Flugan | |
| 4,698,591 A | 10/1987 | Glover et al. | |
| 4,864,241 A | 9/1989 | Goldie | |
| 4,928,063 A | 5/1990 | Lampman | |
| 4,950,994 A * | 8/1990 | Glover et al. | ................ 324/320 |
| 5,442,290 A * | 8/1995 | Crooks | ........................ 324/309 |
| 6,025,715 A * | 2/2000 | King et al. | ................... 324/309 |
| 6,154,030 A | 11/2000 | Wurl | |
| 6,191,582 B1 * | 2/2001 | Zur | ............................. 324/307 |
| 6,377,043 B1 | 4/2002 | Aldefeld | |
| 7,002,343 B2 | 2/2006 | Weissenberger | |
| 7,071,691 B2 | 7/2006 | Lendi | |
| 7,239,143 B2 * | 7/2007 | McBride | ..................... 324/322 |
| 2004/0227513 A1 | 11/2004 | Weissenberger | |

FOREIGN PATENT DOCUMENTS

| | | |
|---|---|---|
| EP | 0 228 056 | 7/1987 |
| WO | WO 99/50681 | 10/1999 |
| WO | WO 2004/104613 | 12/2004 |

\* cited by examiner

*Primary Examiner*—L. M. A.
(74) *Attorney, Agent, or Firm*—Paul Vincent

(57) ABSTRACT

A method for driving a power supply (84) of a magnetic field coil (85) for generating a predetermined magnetic field profile $\underline{B}(\underline{r},t)$ in the volume under investigation of a nuclear magnetic resonance (=NMR) apparatus (81), wherein for compensation of distortions caused by the apparatus, an input signal i(t) is predistorted, that predetermines the time behavior of the magnetic field profile, wherein the power supply (84) is driven by the predistorted signal o(t), is characterized in that the predistortion is performed using a transfer function of the form $$G(s) = \frac{O(s)}{I(s)} = \frac{\sum_{n=0}^{N} s^n b_n}{\sum_{n=0}^{N} s^n a_n},$$

with $s=\sigma+j\omega$, $s \in \mathbb{C}$, and with $N \geq 2$, wherein O(s) is the Laplace transform of o(t), and I(s) is the Laplace transform of i(t). This inventive method improves compensation of distortions of one or more gradient fields including their correlations during rapid switching.

17 Claims, 8 Drawing Sheets

AUTOMATIC DIGITAL PREEMPHASIS FOR DYNAMIC NMR-MAGNETIC FIELDS BY MEANS OF A DIGITAL IIR FILTER

This application claims Paris Convention priority of DE 10 2006 001 194.5 filed Jan. 10, 2006 the complete disclosure of which is hereby incorporated by reference.

BACKGROUND OF THE INVENTION

The invention concerns a method for driving a power supply of a magnetic field coil for generating a predetermined magnetic field profile $\underline{B}(\underline{r},t)$ in the volume under investigation of a nuclear magnetic resonance (=NMR) apparatus, wherein an input signal i(t) that predetermines the time behavior of the magnetic field profile, is previously distorted to compensate for distortions caused by the apparatus, and wherein the power supply is driven by the pre-distorted signal o(t).

A method of this type is disclosed e.g. in WO 99/50681.

Nuclear magnetic resonance (NMR) is an important method of instrumental analytics and imaging diagnostics. NMR evaluates the reaction of nuclear spins, which are disposed in a strong magnetic field, to electromagnetic pulses. In particular, in imaging NMR (also called NMR tomography), magnetic field gradients are applied in a volume under investigation in order to obtain encoding, in particular, spatial encoding of the nuclear spins in the volume under investigation. The magnetic field gradients are generated by gradient coils.

During typical NMR measuring sequences, the magnetic field gradients must be switched on and off. A control current is switched for switching a magnetic field gradient. This control current is amplified in a power supply, and the amplified current of the power supply drives an associated gradient coil. The magnetic field generated by the gradient coil does not directly follow the control current flow. Due to eddy currents which are induced in conducting parts of the gradient coil itself and in its surroundings during switching, the magnetic field is distorted directly following current switching. The amplification characteristics of the power supply can also cause field distortions. After e.g. stepped switching of the current, the gradient field only changes slowly and mostly approximately exponentially from its previous value to the new desired value (equilibrium value, desired magnetic field profile). This deviation of the gradient field from a desired value deteriorates the quality of the NMR measurement.

In prior art, distortion of the gradient field is counteracted by pre-distorting the current of the gradient coil. The high-frequency portions of the control current are thereby excessively increased by subjecting a copy of the control current signal to high-pass filtering and adding it to the control current signal. The high-pass filtered copy may either be generated with an analog circuit through suitable inductances and capacitances, or digitally through simulation of high passes (see WO 99/50681).

Iterative methods are conventionally used in order to optimize the current profile in the gradient coil. The distortion circuit mostly comprises several parallel high passes of first order with different time constants. Iteration optimizes the portion of the individual high passes of the distorted current signal.

The gradient field approaches the desired value through conventional measures. An improved coil design additionally reduces the influence of eddy currents on the gradient field. However, the switching speeds of the gradient coils have recently increased, which, in turn, has deteriorated the problems of eddy currents and distortion of the gradient field.

The conventional methods of distortion compensation can only partially compensate for the existing distortions of the gradient field. In particular, they cannot compensate for temporarily oscillating distorted portions. Correlations between several magnetic field coils are also mostly ignored and not compensated for.

It is therefore the underlying purpose of the present invention to further improve compensation of distortions of the gradient field during fast switching and, in particular, permit compensation of oscillating distorted portions and optionally of correlations among the magnetic field coils.

SUMMARY OF THE INVENTION

This object is achieved by a method of the above-mentioned type which is characterized in that pre-distortion is effected using a transfer function of the form $$G(s) = \frac{O(s)}{I(s)} = \frac{\sum_{n=0}^{N} s^n b_n}{\sum_{n=0}^{N} s^n a_n},$$

with $s = \sigma + j\omega$, $s \in C$, and with $N \geq 2$, wherein O(s) is the Laplace transform of o(t), and I(s) is the Laplace transform of i(t). C is thereby the set of complex numbers.

The invention initially fully utilizes the possibilities offered by digital compensation. Conventional compensation methods are limited to correction using high-pass filters of first order and thereby only allow consideration of distortions with an exponential time behavior. In contrast thereto, the inventive transfer function G(s) is designed such that it can easily replicate both transient exponential behavior (effected by the summands up to n=1) and temporarily oscillating behavior (effected by the summands n=2 and higher). A sufficiently high N also compensates for distortions which have a complicated time dependence, in particular, a non-monotonic time behavior. Very good compensation results can already be obtained with N=6 with reasonable calculation effort.

One variant of the inventive method is particularly preferred, wherein $\sigma=0$, with $O(j\omega)$ being the Fourier transform of o(t), and $I(j\omega)$ being the Fourier transform of i(t).

In one particularly preferred variant, the magnetic field coil comprises a gradient coil for generating a magnetic field profile $GR_x$ with a magnetic field gradient which is constant in one spatial direction x. Compensation of distortion of one switched magnetic field gradient (predetermined magnetic field profile) for a gradient coil (magnetic field coil) is the most important application of the inventive method. Compensation of distortions of magnetic field profiles of shim systems is e.g. also considered.

One method variant is also preferred, wherein G(s) is converted into a digital IIR filter (infinite impulse response filter), the IIR filter having, in particular, the following form:

$$o(t_l) = \sum_{n=0}^{N} c_n i(t_{l-n}) - \sum_{n=1}^{N} d_n o(t_{l-n}),$$

with l: index of time quantization. This variant realizes the inventive method "on the fly", i.e. an incoming control current signal (input signal) can be predistorted immediately without having to wait for the further current signal behavior.

In one additional advantageous variant of the inventive method, the parameters $a_n$, $b_n$ are determined as follows:
a) a test pulse $i^*(t)$ is supplied to the power supply;
b) the time dependence of the resulting magnetic field profile $o^*(t)$ of the magnetic field coil is measured;
c) using $$O^*(s)=G^{-1}(s)I^*(s)$$

$G^{-1}$ is determined, wherein $O^*(s)$ is the Laplace transform of $o^*(t)$ and $I^*(s)$ is the Laplace transform of $i^*(t)$;
d) $G^{-1}$ yields G through inversion;
e) the parameters $a_n$, $b_n$ are determined from G by solving the non-linear compensation problem.

This variant permits simple and fast determination of the parameters required for compensation.

In a preferred further development of this variant, one of the following methods is applied in step e): Gauβ-Newton method, Levenberg-Marquardt method. These methods are well established.

The invention also comprises a method for driving power supplies of magnetic field coils of an NMR apparatus, wherein the magnetic field coils are designed to generate a predetermined, time variant magnetic field profile $\underline{B}(\underline{r},t)$ in the volume under investigation of the NMR apparatus, wherein K power supplies are provided, each driving one magnetic field coil, with $K \geq 2$, wherein for compensating distortions caused by the apparatus, input signals $i_k(t)$ are predistorted, with k: channel index between 1 and K, wherein the input signals $i_k(t)$ predetermine the time behavior of the magnetic field profile, wherein the power supplies are driven with the predistorted signals $o_k(t)$ and wherein compensation also considers interaction among the magnetic field coils, which is characterized in that predistortion is effected using a transfer matrix $\underline{\underline{G}}$, wherein $\underline{\underline{G}}$ represents a K×K matrix for which applies $\underline{O}=\underline{\underline{G}}\cdot\underline{I}$, with $$G_{pq} = \frac{\sum_{n=0}^{N} s^n b_{n,pq}}{\sum_{n=0}^{N} s^n a_{n,pq}},$$

wherein $N \geq 2$, with $\underline{O}=(O_1, \ldots, O_K)$ and $\underline{I}=(I_1, \ldots, I_K)$,
wherein $O_k(s)$ is the Laplace transform of $o_k(t)$,
and $I_k(s)$ is the Laplace transform of $i_k(t)$,
with $s=\sigma+j\omega$, $s \in \mathbb{C}$. Single underlining thereby means a vector, and double underlining a matrix. This method generalizes the above-described method for one dimension to K dimensions and includes cross-correlations in distortion compensation. Taking into consideration cross-correlations even facilitates adjustment of the actual magnetic field profile, e.g. of the gradient fields, to the predetermined magnetic field profile (desired fields).

The method can thus be used for driving several power supplies for one magnetic field coil each, which generate an overall magnetic field profile $\underline{B}(\underline{r},t)$. All input signals $i_k(t)$ are thereby predistorted taking into consideration the obtained correlations, and the power supplies are driven by the predistorted signals $o_k(t)$.

In one particularly preferred variant of this method, $\sigma=0$, $O_k(j\omega)$ is the Fourier transform of $o_k(t)$, and $I_k(j\omega)$ is the Fourier transform of $i_k(t)$.

In one particularly preferred method variant, at least two magnetic field coils each comprise a gradient coil for generating a magnetic field profile $GR_k$ with a magnetic field gradient which is constant in one spatial direction k, in particular, wherein the spatial directions of the magnetic field gradients of different gradient coils are orthogonal. Compensation of distortions of magnetic field gradients is again the most important application of the inventive method. However, other applications, such as e.g. in shim systems, are also possible.

One variant of the inventive method is also advantageous, wherein $\underline{\underline{G}}$ is converted into a system of digital IIR filters (infinite impulse response filter), in particular, wherein the IIR filter has the following form for each channel k:

$$o_k(t_l) = \sum_{q=1}^{K} o_{kq}(t_l) \text{ with}$$

$$o_{pq}(t_l) = \sum_{n=0}^{N} c_{n,pq} i_q(t_{l-n}) - \sum_{n=1}^{N} d_{n,pq} o_{pq}(t_{l-n}),$$

and l: index of time quantization. This variant realizes the inventive method "on the fly", i.e. an incoming control current signal (input signal) can be immediately distorted without having to wait for the further current signal behavior.

In a preferred variant, the parameters $a_{n,pq}$, $b_{n,pq}$ are determined as follows:
a) a first test pulse $i_1^*(t)$ is supplied to a first power supply;
b) the time behavior of the magnetic field components $o_k^*(t)$ (k=1 . . . K) of the K magnetic field coils is measured from the resulting magnetic field profile;
c) using $$\underline{O}^*=\underline{\underline{G}}^{-1}\cdot\underline{I}^*$$

the inputs of the first column of $\underline{\underline{G}}^{-1}$ are determined,
with $\underline{O}^*=(O^*_1, \ldots, O^*_K)$ and $\underline{I}^*=(I^*_1, \ldots, I^*_K)$,
wherein $O^*_k(s)$ is the Laplace transform of $o^*_k(t)$,
and $I^*_k(s)$ is the Laplace transform of $i^*_k(t)$;
d) the steps a) through c) are repeated for the channels 2 to K;
e) $\underline{\underline{G}}$ is determined from $\underline{\underline{G}}^{-1}$ through matrix inversion;
f) the parameters $a_{n,pq}$, $b_{n,pq}$ are determined from $\underline{\underline{G}}$ by solving the non-linear compensation problem.

This variant permits simple and fast pre-determination of the parameters that are required for compensation.

In an advantageous further development of this variant, one of the following methods is applied in step f): Gauβ-Newton method, Levenberg-Marquardt method. These methods are well established.

The invention also comprises a control means for an NMR apparatus, wherein the control means is designed for performing one of the above-described inventive methods. The control means can distort incoming current signals in accordance with the invention, and the distorted current signals can be used for driving power supplies of magnet coils to obtain a magnetic field profile in a volume under investigation, which comes very close to a predetermined magnetic field profile.

The invention finally also concerns an NMR apparatus comprising a pulse generator means, one or more power supplies and a magnetic field coil for each power supply, characterized in that the NMR apparatus comprises an inventive control means which connects the pulse generator means to the power supply/supplies. The NMR apparatus may, in particular, be an NMR tomograph or an NMR spectrometer.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is shown in the drawing and is explained in more detail with reference to embodiments.

DESCRIPTION OF THE PREFERRED EMBODIMENT

Figure 1:
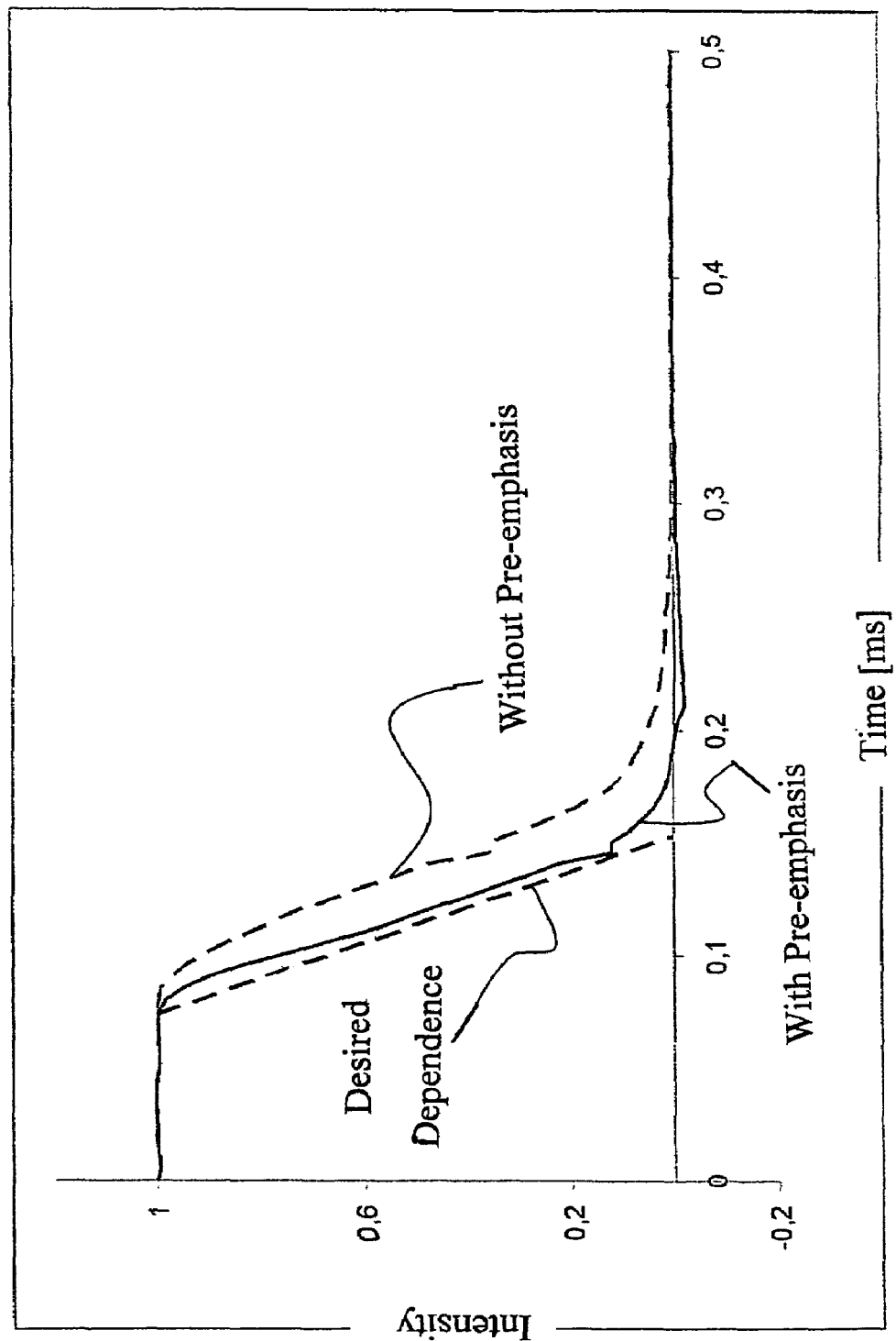
FIG. 1 shows a diagram of the intensity behavior with time of a gradient field $GR_x$ in x-direction for a first NMR apparatus during and shortly after the switching ramp of the associated x gradient current, comparing to the desired behavior, measured behavior without pre-distorting measures and measured behavior with inventive predistortion measures.

The invention concerns automatic digital preemphasis for dynamic NMR magnetic fields through digital IIR filters.

In many fields of nuclear magnetic resonance spectroscopy (NMR), the homogeneous $B_0$ magnetic field is superposed by additional gradient (magnetic) fields. In MR imaging (MRI), these fields are e.g. used for spatially dependent excitation of the proton nuclei [3]. A gradient field is generally composed of three gradient field components $GR_x$, $GR_y$ and $GR_z$ (one for each spatial direction). A pulse sequence for these three gradients defines the current that flows through the coils and thereby the time behavior of the overall gradient field which is proportional thereto.

Due to eddy current effects in metallic components in the magnet and inductive load of the gradient coils, the frequency behavior of the gradient amplifiers and correlations among the gradient coils, the gradient field does not exactly follow the predetermined current behavior. In MRI, these deviations produce e.g. artifacts and phantom images in the recorded image.

For this reason, the gradient signals are predistorted by a preemphasis unit such that they compensate for the disturbing effects.

Preemphasis methods are generally based on a linear and a time-invariant system:

Pulse sequence->(preemphasis->) amplifier->gradient coils-> gradient field

Thus, the system behavior for a channel C (e.g. X gradient) can be uniquely characterized by its frequency characteristic $G_C(j\omega)$ [1]. The frequency characteristic of the system for one channel C is designated below with $S_C(j\omega)$ and the frequency characteristic of the preemphasis with $P_C(j\omega)$—also including any cross-correlations $S_{C1->C2}(j\omega)$ (effect of the $C_1$ gradient on the $C_2$ gradient) and their correction $P_{C1->C2}(j\omega)$.

In former analog preemphasis units for gradient systems, additional high passes of first order are added to the input signal, whose amplitudes $k_i$ and time constants $\tau_i$ are variable. One thereby assumes that the effects to be compensated for respond to a step function with a sum of decaying e-functions of the form $$k \cdot e^{-\frac{t}{\tau}}.$$

The compensating analog circuits thereby have a frequency characteristic of the form:

$$P_C(j\omega) = 1 + \sum_i k_i \cdot \frac{\tau_i(j\omega)}{1 + \tau_i(j\omega)} \tag{1}$$

There are many ways of determining the parameters $k_i$ and $\tau_i$. These are often manually (and iteratively) determined. There are, however, also automatic determination methods. Some determine the parameters also iteratively with several correction measurements, others calculate them based on a reference measurement through the time response of the system to a step function. The cross-correlations are often not considered due to the complexity ([6][7][8][9][10]).

It is not possible to compensate for all linear effects with this type of preemphasis. It is e.g. not possible to compensate for oscillations through summing high passes of first order.

Current digital preemphasis systems generally simulate these analog RC circuits through IIR filters according to [11]. Due to the digital hardware components, the time constants can be freely selected (even time constants of a few μs can be calculated). Further advantages of the digital design are noise suppression, flexibility, long-term stability and reproducibility of the results. Component tolerances and temperature dependencies of analog components are also eliminated. It has turned out within the scope of the invention that the digital preemphasis offers much more profound possibilities for compensation and system simulation.

This invention presents a generalized method for digital preemphasis of gradient fields. The required preemphasis system is modeled over all channels using a mathematical system description.

Only a general mathematical system description permits extensive compensation of all undesired system effects, also of cross-correlation. The following is based on a magnetic field component system with $K \in \underline{\underline{N}}$ components (e.g. gradients or shims). Each component $C_i$ is driven by a (digital) temporal input signal $i^*_c(t)$ which is transmitted to the coil via amplifiers. The resulting temporal gradient field is designated with $o^*_c(t)$.

It has proven to be useful to investigate the behavior of the system in the frequency domain and not in the time domain. $I^*_c(j\omega)$ is thereby the Fourier transform of the input signal $i^*_c(t)$ and $O^*_c(j\omega)$ is the Fourier transform of $o^*_c(t)$. Assuming linearity, the resulting magnetic field of a component C can be always described:

$$O_C^*(j\omega) = \sum_{i=1}^{K} S_{Ci \to C}(j\omega) \cdot I_{Ci}^*(j\omega)$$

In words: The resulting magnetic field component $O^*_c(j\omega)$ is composed on the one hand of the input signal ($C_i = C$) distorted by the system, and the cross-correlations through other switched components ($C_i \neq C$).

The overall system $S_i$ consisting of all input and output signals can be represented as a closed linear system. $\underline{\underline{S}} \in (\underline{\underline{R}} \to \underline{\underline{C}})^{K \times K}$ be the transfer matrix of the system with $\overline{\overline{S}}_{pq}(j\omega) = S_{Cq \to Cp}(j\omega)$, which yields $$\begin{pmatrix} O_{C1}^*(j\omega) \\ \vdots \\ O_{CK}^*(j\omega) \end{pmatrix} = S \cdot \begin{pmatrix} I_{C1}^*(j\omega) \\ \vdots \\ I_{CK}^*(j\omega) \end{pmatrix}$$

By connecting upstream of the system S a preemphasis system for compensation input signal(s)->P->S->gradient field the definition $$P := S^{-1}$$

produces the desired result (gradient field corresponds to the input signal). In order to establish the required preemphasis matrix P, the functions $S_{pq}(j\omega)$ must be determined and the matrix $\underline{\underline{S}}$ subsequently inverted.

The matrix $\underline{\underline{S}}$ can be determined column by column. The functions in column i describe the effect of the i-th input signal on all outputs. By switching a high-frequency signal $i^*_{Ci}(t)$ (e.g. rectangular or ramp function) and measuring the resulting fields $o^*_{C1}(t) \ldots o^*_{CK}(t)$, the column inputs $S_{ki}(j\omega)$ can be calculated. Depending on the type of measuring method that is used, determination is effected through K measurements. In general, an input $S_{pq}(j\omega)$ can be calculated using the relationship $$S_{pq}(j\omega) = \frac{O_{Cq \to Cp}^*(j\omega)}{I_{Cq}^*(j\omega)} \text{ with } I_{Cq}^*(j\omega) = 0 \text{ for } i \neq q$$

By determining the preemphasis matrix $\underline{\underline{P}}$ through inversion of $\underline{\underline{S}}$, the required transfer functions for maximum compensation are determined. For an upstream preemphasis which pre-distorts the signal on-the-fly, this representation is, however, still not useful. The entries of $\underline{\underline{P}}$ contain the discretized system functions. For a finite number of frequencies $\omega_i$, the respective function values are available. A previously known input signal $i(t)$ could be predistorted in frequency space with this information and thereby produce an ideal gradient behavior except for non-linearities in the system.

For a preemphasis system which has no a priori knowledge of the overall signal, analytical and rational approximations must be found for the scanned system functions of the matrix $\underline{\underline{P}}$. This description permits construction of digital (IIR) filters which predistort the signal on-the-fly.

To be more precise, an IIR system (infinite impulse response) $G(j\omega)$ of the order N has a rational frequency characteristic of the form ($a_i, b_i \in \underline{\underline{R}}$)

$$G(s) = \frac{a_0 + a_1 \cdot (j\omega) + a_2 \cdot (j\omega)^2 + \ldots + a_N \cdot (j\omega)^N}{b_0 + b_1 \cdot (j\omega) + b_2 \cdot (j\omega)^2 + \ldots + b_N \cdot (j\omega)^N} \quad (2)$$

For each discrete preemphasis function $P_{pq}(j\omega)$ (entries of the matrix $\underline{\underline{P}}$), a rational approximation $\tilde{P}_{pq}(j\omega) \approx P_{pq}(j\omega)$ is determined which propagates the frequency dependence in a continuous fashion. The required parameters $a_i$ and $b_i$ from equation 2 may thereby be determined through standard procedures such as Gauss-Newton or Levenberg-Marquardt methods [5].

These time-continuous IIR filters $\tilde{P}_{pq}(j\omega)$ are now converted through standard transformations such as bilinear transformation into time-discrete IIR filters $\tilde{P}_{pq}(e^{j\omega})$ [2][4] which permit digital correction of the input signals on-the-fly with the required system behavior. To be more precise, this transformation provides real parameters $c_i$, $d_i$ with which a temporal input signal $i[l]$ ($l$ is the discrete time increment) is filtered based on the instantaneous value $i[l]$ and the last N input and output values through the following prescripton ($o[l]$ output signal of the filter)

$$o[l] = \sum_{n=0}^{K} c_n \cdot i[l-n] - \sum_{n=1}^{N} d_n \cdot o[l-n] \quad (3)$$

The algebraic relationships in the matrix $\underline{\underline{P}}$ finally provide the required IIR filter system for compensation. $I_k[l]$ are the K input signals of the preemphasis system and $o_k[l]$ are the K predistorted output signals which control the gradient system, thus $K^2$ filters $$o_{pq}[l] = \sum_{n=0}^{K} c_{n,pq} \cdot i_q[l-n] - \sum_{n=1}^{N} d_{n,pq} \cdot o_{pq}[l-n],$$

calculate the contributions of all inputs to the outputs for each discrete time $l$. The resulting output signals are obtained through summing over each row:

$$o_k[l] = \sum_{q=1}^{K} o_{kq}[l]$$

These calculations are performed by a digital signal processor (DSP).

In case that only one channel (special case K=1: individual channel or no cross-correlations), C shall be compensated for or the cross-correlations need not be taken into consideration, the equations of the last section are simplified. The preemphasis function $P_C(j\omega)$ is thereby established from the measured system function $S_C(j\omega)$ through elementary inversion, and is rationally approximated. The time-discrete conversion finally produces a digital IIR filter like in equation 3 for compensation.

An IIR system with N=1 (filter of first order) is a special case and corresponds to a summand of equation 1 and therefore the digital preemphasis systems of prior art (in sum). In accordance with the invention, a system of order N≧2 is preferred. These more general systems can compensate for more varied effects, i.e. also oscillations.

FIGS. 1 through 7 show the effect of the inventive drive method using experimental measuring results for different NMR apparatus. The NMR apparatus are each provided with identical magnet coils but have different power supply amplifying characteristics.

In all experiments, a pulse generator means predetermines a desired dependence of a gradient field $GR_x$ in x-direction in the form of a current ramp via a control current (input current). A falling, linear ramp of 80 μs ramp duration was selected. The ramp starts at a time of 75 μs; a desired magnetic field of normalized intensity 1 is predetermined before ramp start, and after ramp end, a desired magnetic field of an intensity 0.

FIG. 1 shows the time behavior of the intensity of a gradient field $GR_x$ of a x gradient coil for a first NMR apparatus compared to the desired behavior, behavior without any predistortion ("without preemphasis"), and with the inventive predistortion method ("with preemphasis"). FIG. 1 and the other figures thereby take into consideration correction coefficients up to order N=6 in accordance with the invention. The magnetic field intensity is plotted vertically, and time horizontally.

Without predistortion, the magnetic field reacts only with great delay to the change in the desired behavior. At the end of the ramp, the residual intensity is still more than 0.3 when no predistortion is performed.

In comparison thereto, the inventive digital predistortion can produce a magnetic field behavior close to the desired behavior. At ramp end, the magnetic field intensity is only approximately 0.1 in this case.

Figure 2:
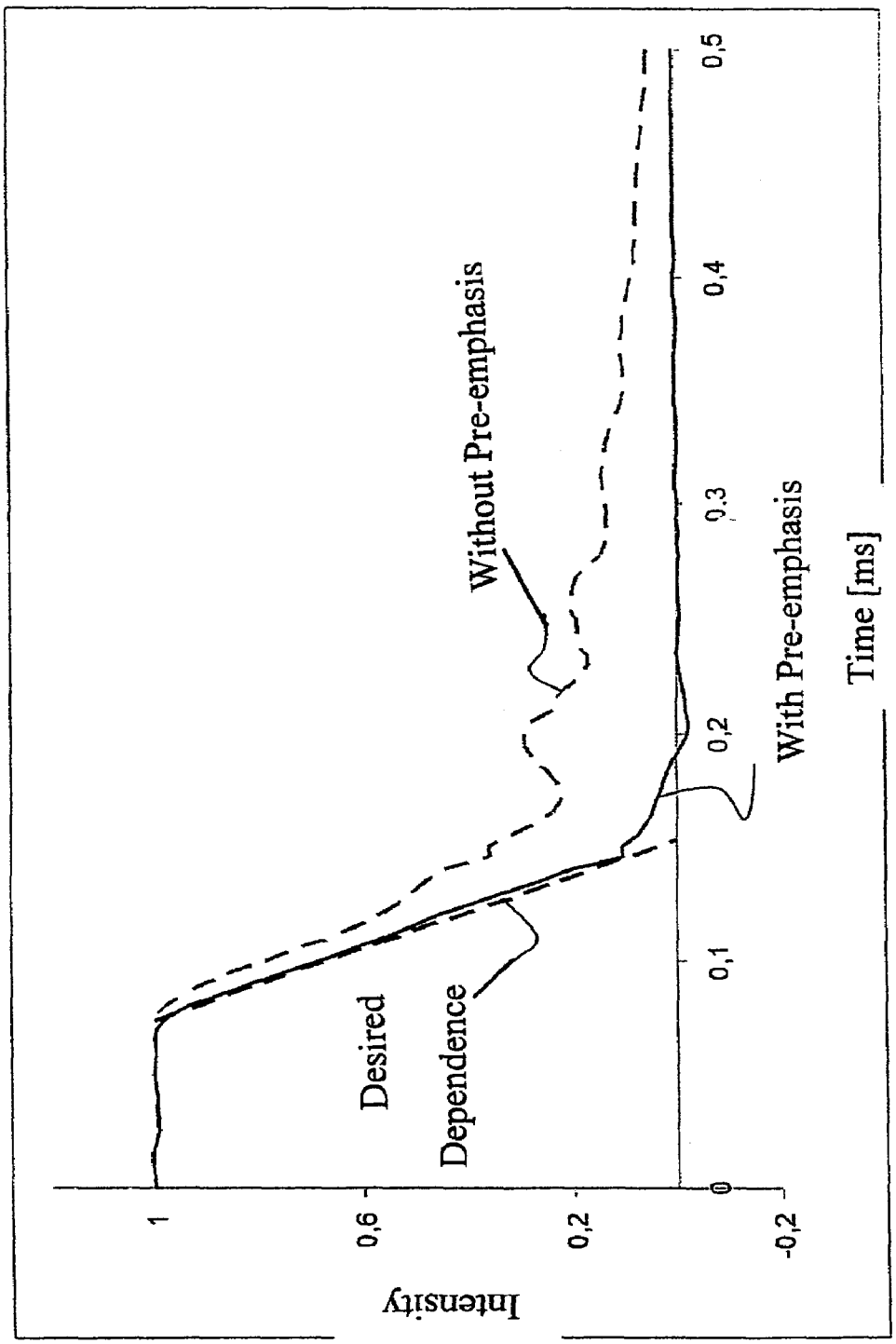
FIG. 2 shows a diagram like FIG. 1 for a second NMR apparatus which has a tendency towards gradient field oscillations.
Figure 3:
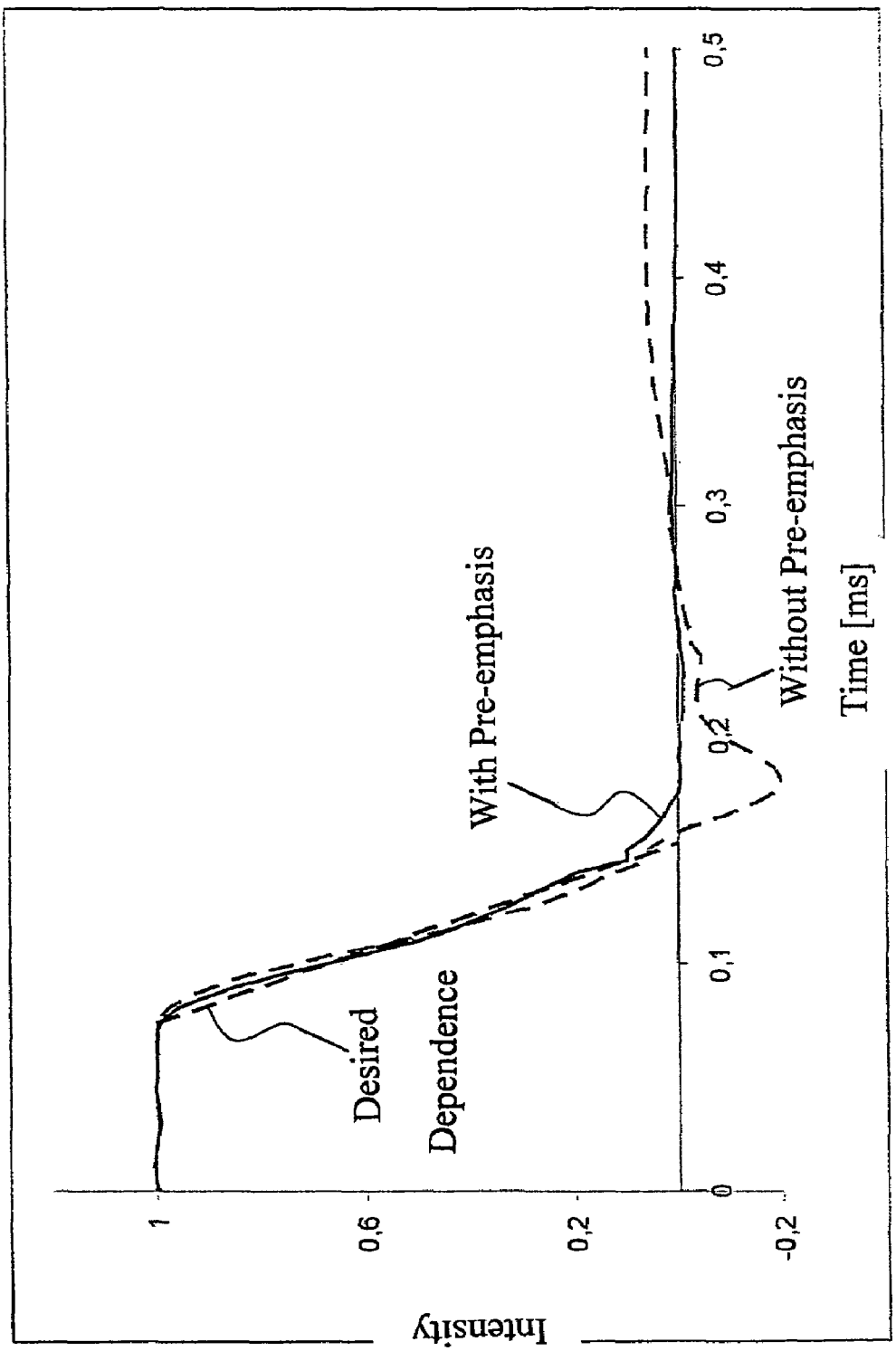
FIG. 3 shows a diagram like FIG. 1 for a third NMR apparatus.

FIGS. 2 and 3 show further examples of the effect of the inventive predistortion on other NMR apparatus.

The NMR apparatus of FIG. 2 has a great tendency for temporary oscillations of the magnetic field behavior, i.e. the intensity behavior after the switching ramp shows several local minima and maxima. Such temporal oscillations cannot be controlled with conventional compensation methods. The inventive method can realize a magnetic field behavior close to the desired behavior.

Strong temporal overswinging of the magnetic field behavior like in the NMR configuration of FIG. 3 can be well compensated for with the inventive method.

Figure 4:
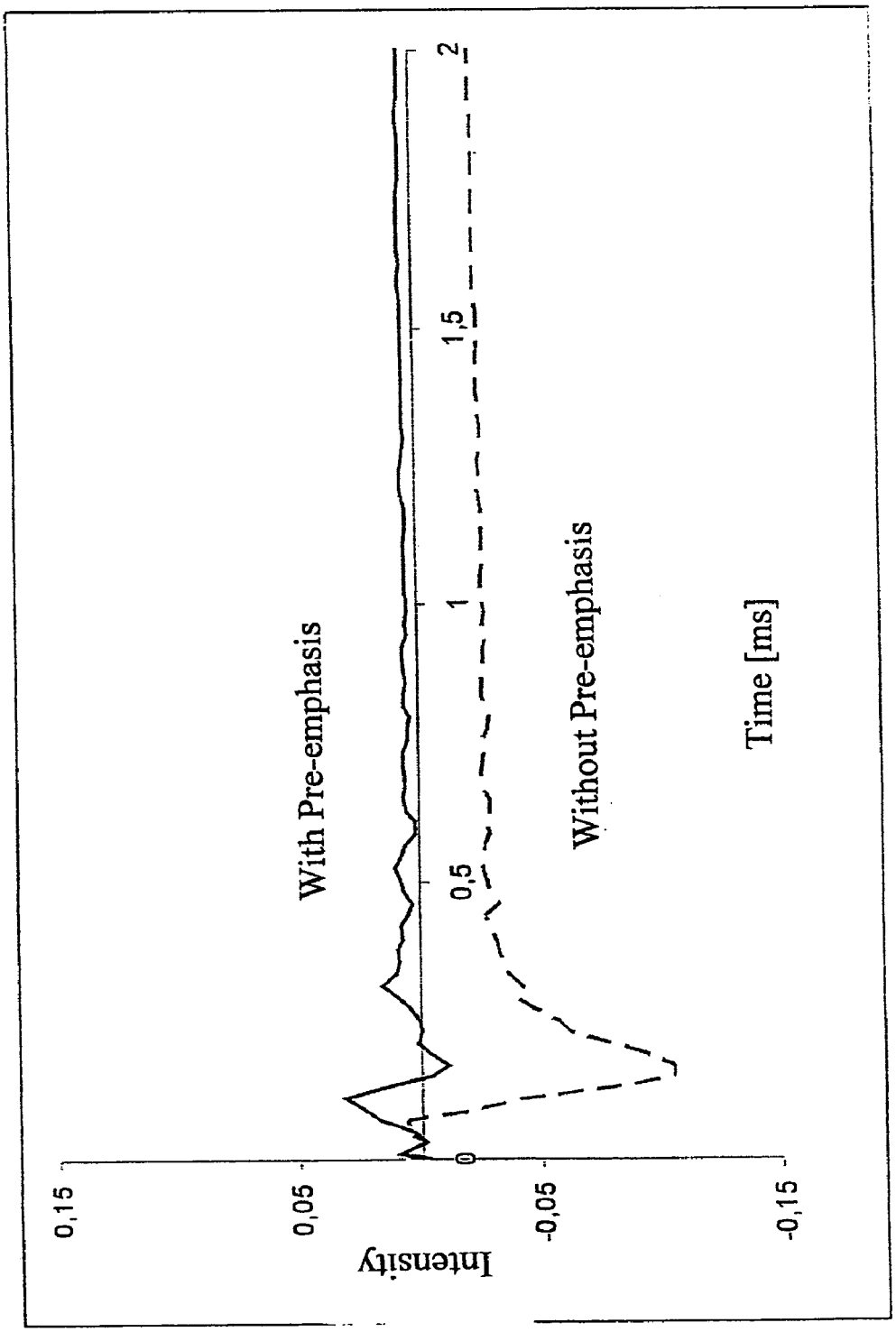
FIG. 4 shows a diagram of the time behavior of the $B_0$ field for a fourth NMR apparatus during and shortly after the switching ramp of the x gradient current for the gradient field $GR_x$ compared to the measured behavior without predistortion measures and measured behavior with inventive predistortion measures with cross-compensation.

FIG. 4 shows the time behavior of the magnetic field $B_0$ in the z-direction, i.e. the direction of the main magnetic field which is perpendicular to the x-direction. The gradient field $GR_x$ in x-direction that is switched like in FIGS. 1 through 3 also influences the $B_0$ field (compare the curve drawn with broken lines "without preemphasis"). The $B_0$ field can be considerably reduced through inventive cross term compensation x->$B_0$, in particular during the switching ramp at times between 0.075 ms to 0.155 ms (compare the curve drawn with full lines "with preemphasis").

Figure 5:
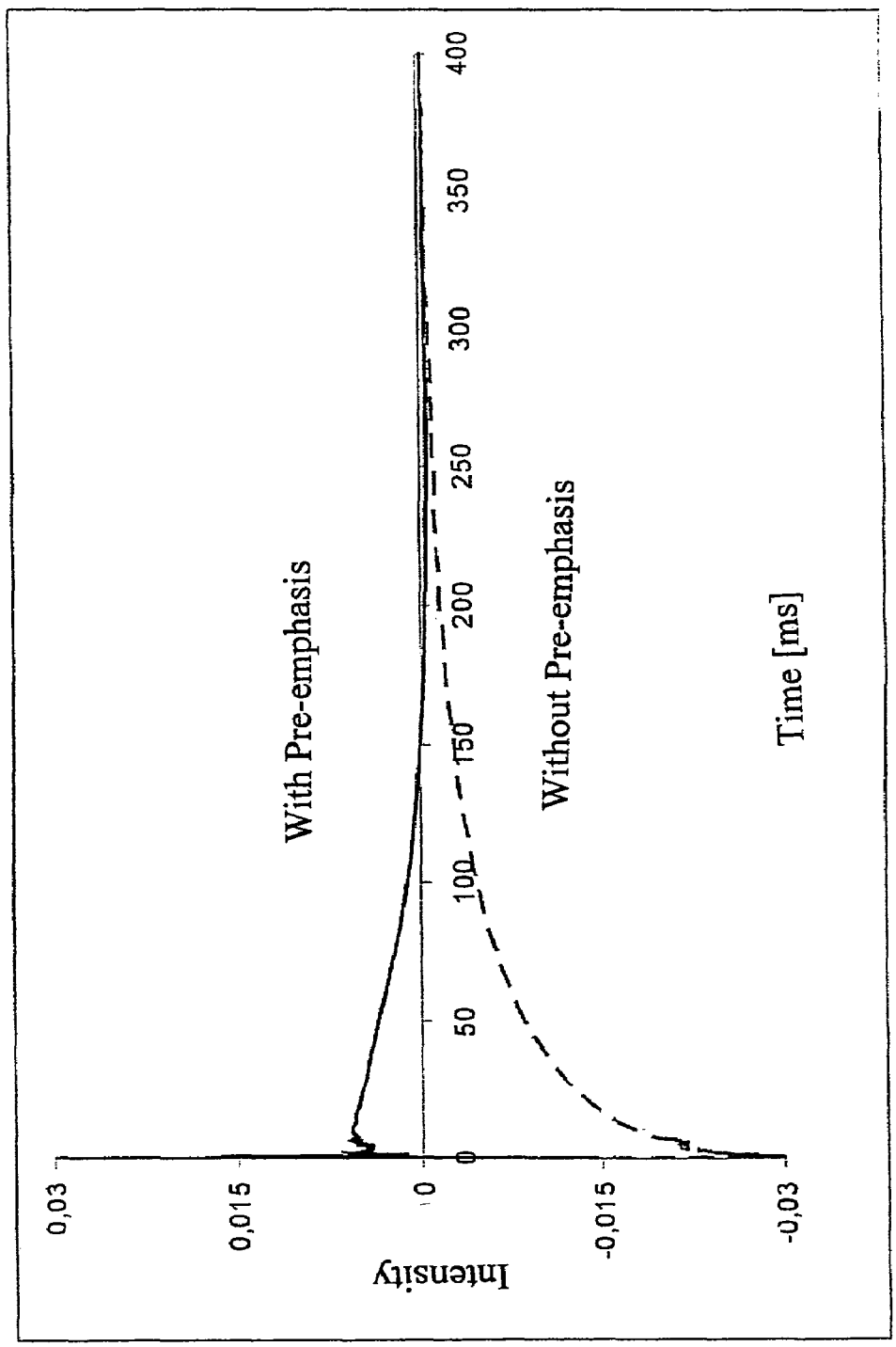
FIG. 5 shows a diagram of the time behavior of the $B_0$ field of FIG. 4 with a longer observation period after the switching ramp.
Figure 6:
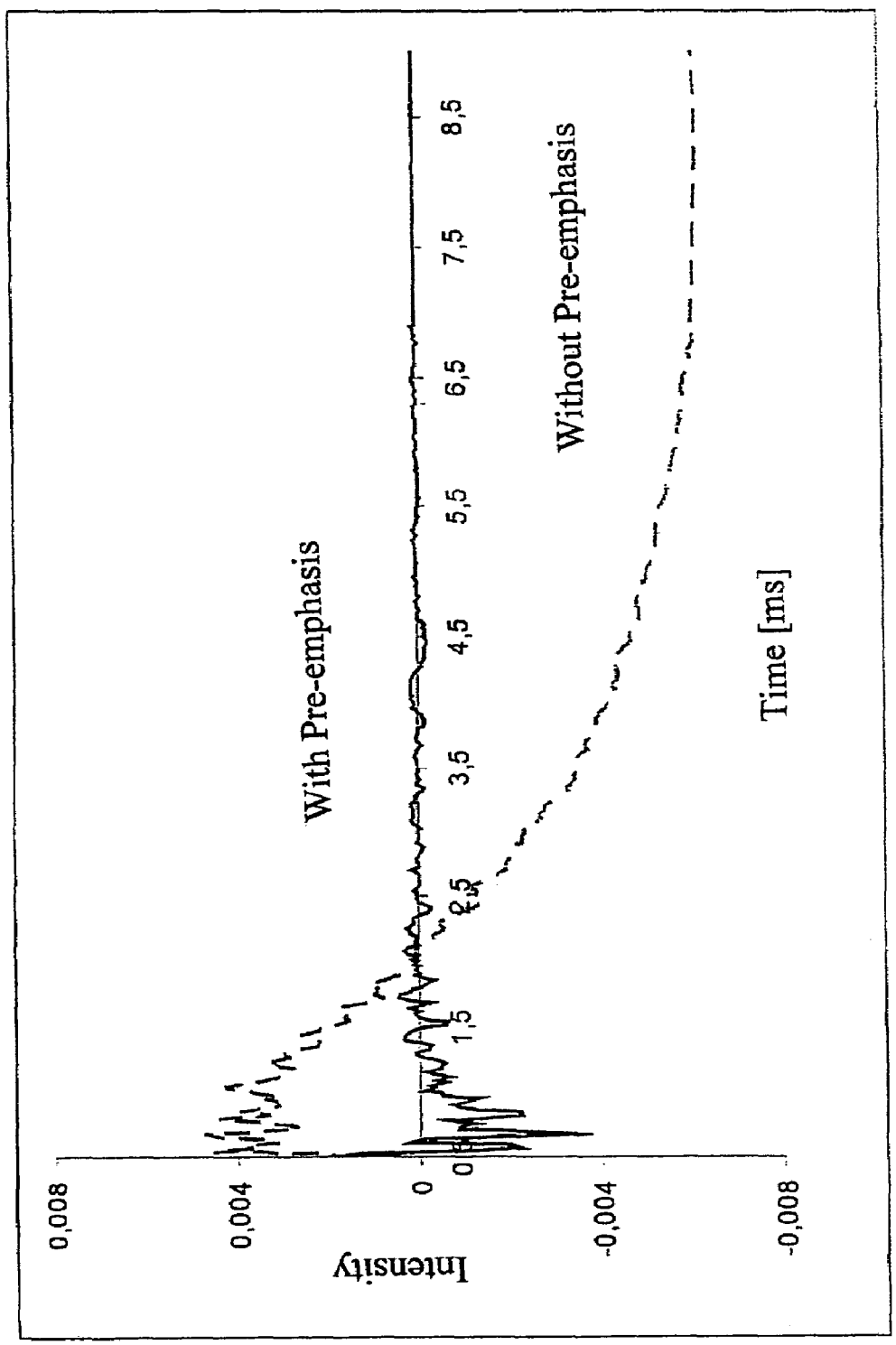
FIG. 6 shows a diagram of the intensity behavior with time of a gradient field $GR_x$ in x-direction for a fifth NMR apparatus in a time window close to the switching ramp of the associated x gradient flow compared to the measured behavior without predistortion measures and measured behavior with inventive predistortion measures.
Figure 7:
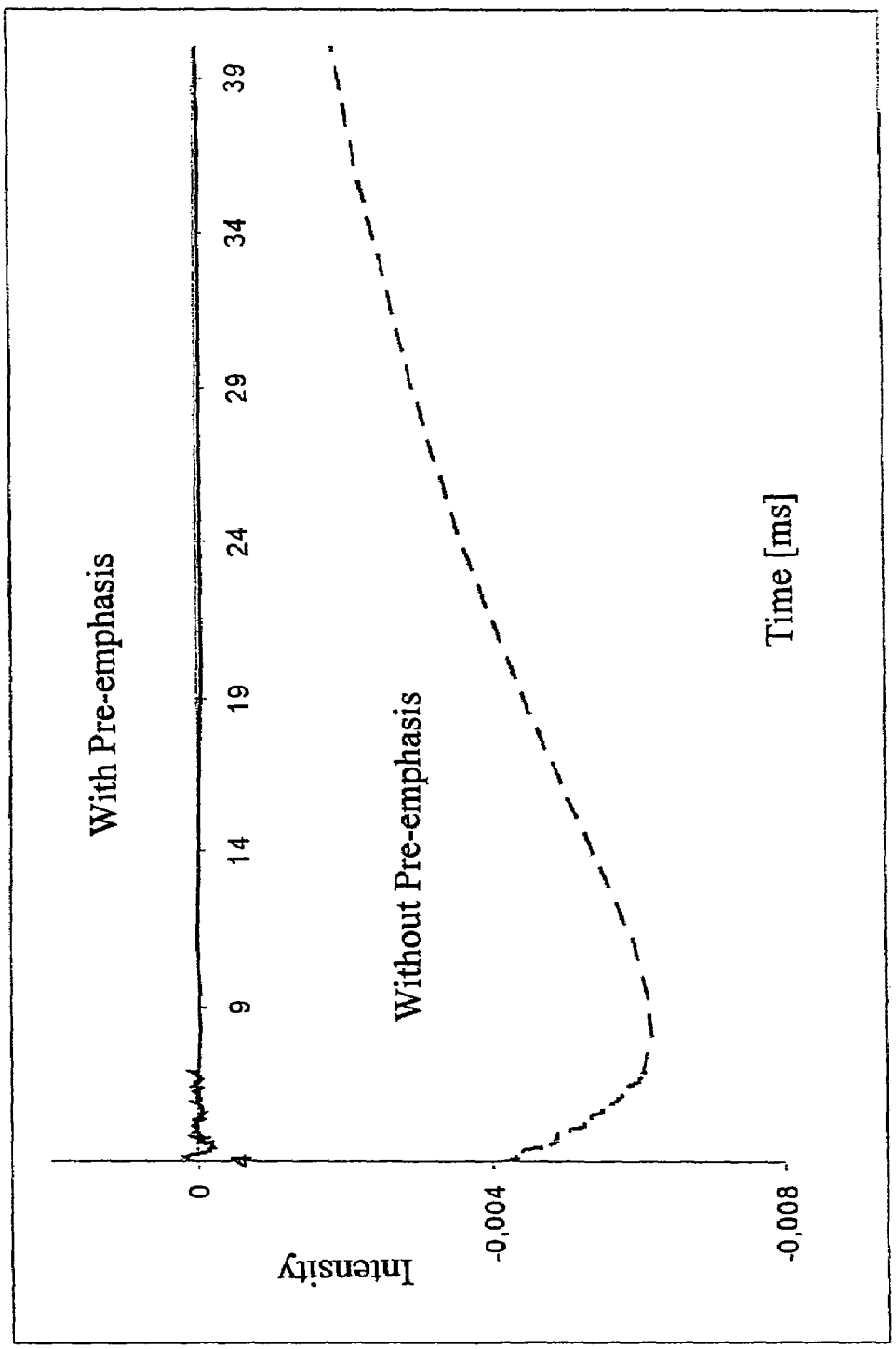
FIG. 7 shows a diagram of the intensity behavior with time of the gradient field of FIG. 6 in a larger time window.

FIG. 5 shows the behavior of $B_0$ of FIG. 4 over a longer period. The $B_0$ field decays much faster in the long term range with the inventive predistortion with cross term compensation.

FIGS. 6 and 7 again show the intensity of a gradient field $GR_x$ in the x-direction in a circuit of the x gradient current like in FIGS. 1 through 3, wherein measurement is performed in respective longer time windows and at a greater distance from the switching ramp. The inventive predistortion yields much faster adjustment of the gradient field to the desired behavior. In particular, low-frequency signal errors can be compensated for well during long switching of the gradient coils.

Figure 8:
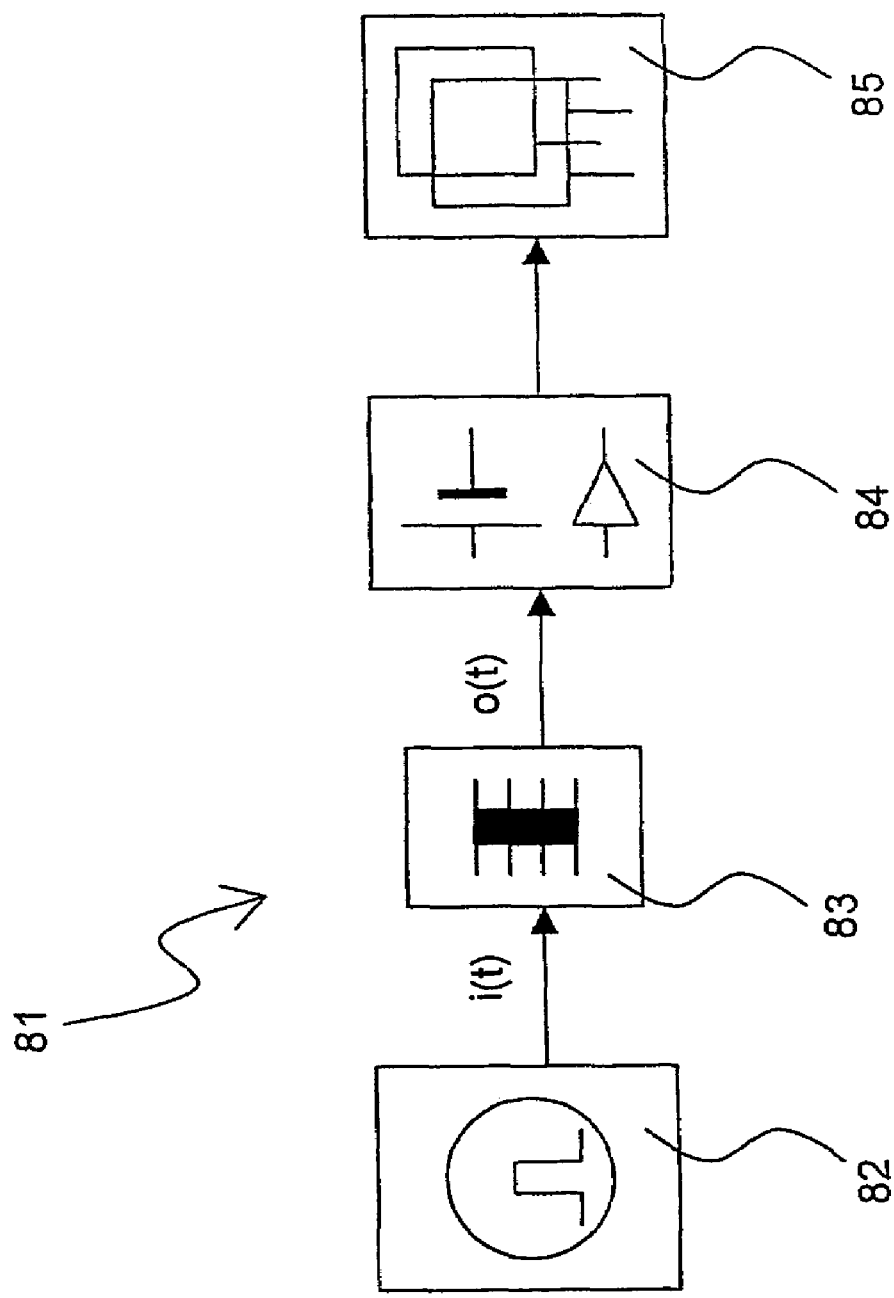
FIG. 8 shows a schematic representation of an inventive NMR apparatus.

FIG. 8 shows an inventive NMR apparatus 81 for realizing the inventive drive method. The NMR apparatus 81 comprises a pulse generator means 82 that predetermines the time behavior of a magnetic field profile in a volume under investigation. The pulse generator means 82 thereby generates a control current signal or input signal i(t) which is directly proportional to the magnetic field intensity of the desired predetermined magnetic field profile. The input signal i(t) is then predistorted, i.e. changed, in a digital control means 83. The distorted signal o(t) is supplied to a power supply 84. This power supply 84 amplifies the predistorted signal o(t) and thereby provides the operating current for a magnetic field coil 85. The magnetic field coil 85 generates a magnetic field profile in the volume under investigation. This magnetic field profile is distorted by the NMR apparatus itself. By changing the input signal i(t) in the control means 82, the distortions of the magnetic field profile caused by the NMR apparatus 81 are compensated for such that the magnetic field profile obtained in the volume under investigation corresponds to the predetermined magnetic field profile.

For changing the input signal i(t), the control means 82 utilizes a transfer function which can be determined absolutely freely and is represented by a series expansion. This transfer function is not formed by analog circuits nor does it simulate analog circuits of high passes of first order. The inventive transfer function considers, in particular, also expansion terms of quadratic order and preferably further higher orders in time t (or frequency ω). This considerably improves distortion compensation compared to prior art irrespective of whether the distortions are caused by eddy currents or the amplification characteristic of the power supply.

The coefficients of the transfer function of a channel may be determined from one single measurement.

In accordance with the invention, the method may also be used with several power supplies and several magnetic field coils in order to compensate for temporal distortions of the gradient fields and magnetic field portions of higher order (shims) and their correlations.

The inventive method also improves compensation of distortions of one or more gradient fields including their correlations during rapid switching.

LITERATURE

[1] Otto Föllinger and Mathias Kluwe: Laplace-, Fourier-und z-Transformationen, Hüthig, 2003
[2] Emmanuel C. Ifeachor and Barrie W. Jervis: Digital Signal Processing, Addison-Wesley, 1993
[3] Heinz Morneburg: Bildgebende Systeme für die medizinische Diagnostik. Publicis-MCD Verl., 1995
[4] Alan V. Oppenheim, Ronald W. Schafer and John R. Buck: Zeitdiskrete Signalverarbeitung, Pearson Education, 2004
[5] Douglas M. Bates and Donald G. Watts: Nonlinear regression analysis and its applications, Wiley, 1988
[6] U.S. Pat. No. 4,928,063—1990 (Lampman et al.)
[7] U.S. Pat. No. 4,698,591—1987 (Glover et al.)
[8] U.S. Pat. No. 4,864,241—1989 (Goldie)
[9] European patent 0 228 056—1986 (Glover et al.)
[10] U.S. Pat. No. 4,585,995—1986 (Flurgan)
[11] U.S. Pat. No. 6,154,030—2000 (Wurl)

We claim:

1. A method for driving a power supply of a magnetic field coil to generate a predetermined magnetic field profile $\underline{B}(\underline{r},t)$ in a volume under investigation of a nuclear magnetic resonance (=NMR) apparatus, the method comprising the steps of:
   a) predistorting an input signal i(t) that defines a temporal behavior of the magnetic field profile using a transfer function of the form $$G(s) = \frac{O(s)}{I(s)} = \frac{\sum_{n=0}^{N} s^n b_n}{\sum_{n=0}^{N} s^n a_n},$$

with s=σ+jω, s ∈C, and with N≥2, wherein O(s) is the Laplace transform of o(t), and I(s) is the Laplace transform of i(t); and
   b) driving the power supply with the predistorted signal o(t) to compensate for apparatus distortions.

2. The method of claim 1, wherein σ=0, O(jω) is a Fourier transform of o(t), and I(jω) is a Fourier transform of i(t).

3. The method of claim 1, wherein the magnetic field coil comprises a gradient coil for generating a magnetic field profile $GR_x$ with a magnetic field gradient that is constant in one spatial direction x.

4. The method of claim 1, wherein G(s) is converted into a digital IIR filter (infinite impulse response filter) or into an IIR filter having the following form:

$$o(t_l) = \sum_{n=0}^{N} c_n i(t_{l-n}) - \sum_{n=1}^{N} d_n o(t_{l-n}),$$

with l: index of time quantization.

5. The method of claim 1, wherein parameters $a_n$, $b_n$ are determined as follows:
   a) a test pulse i*(t) is supplied to the power supply;
   b) a time behavior of a resulting magnetic field profile o*(t) of the magnetic field coil is measured;
   c) $G^{-1}$ is determined through a correlation $$O^*(s)=G^{-1}(s)I^*(s)$$

wherein O*(s) is a Laplace transform of o*(t), and I*(s) is a Laplace transform of i*(t);
   d) G is determined from $G^{-1}$ through inversion;
   e) parameters $a_n$, $b_n$ are determined from G by solving a non-linear compensation problem.

6. The method of claim 5, wherein step e) comprises at least one of a Gauβ-Newton and a Levenberg-Marquardt method.

7. A method for driving power supplies of magnetic field coils of an NMR apparatus, the magnetic field coils being designed for generating a predetermined time varying magnetic field profile $\underline{B}(\underline{r},t)$ in a volume under investigation of the NMR apparatus, wherein each of K power supplies drives one magnetic field coil, with K≥2, the method comprising the steps of:
   a) predistorting input signals $i_k(t)$, with k: channel index between 1 and K, the input signals $i_k(t)$ defining a time behavior of magnetic field profile, the predistortion being effected using a transfer matrix $\underline{\underline{G}}$ and considering interaction among the magnetic field coils, wherein $\underline{\underline{G}}$ is a K×K matrix and $$\underline{O}=\underline{\underline{G}}\cdot\underline{I},$$

with $$G_{pq} = \frac{\sum_{n=0}^{N} s^n b_{n,pq}}{\sum_{n=0}^{N} s^n a_{n,pq}},$$

wherein N≥2, with $\underline{O}=(O_1,\ldots,O_K)$ and $\underline{I}=(I_1,\ldots,I_K)$, wherein $O_k(s)$ is a Laplace transform of $O_k(t)$, and $I_k(s)$ is a Laplace transform of $i_k(t)$, with s=σ+jω, s ∈C; and
   b) driving the power supplies with the predistorted signals $O_{k(t)}$ to compensate for apparatus distortions.

8. The method of claim 7, wherein σ=0, $O_k(jω)$ is a Fourier transform of $O_k(t)$ and $I_k(jω)$ is a Fourier transform of $i_k(t)$.

9. The method of claim 7, wherein at least two magnetic field coils each comprise a gradient coil for generating a magnetic field profile $GR_k$ with a magnetic field gradient which is constant in one spatial direction k.

10. The method of claim 9, wherein spatial directions of the magnetic field gradients of different gradient coils are orthogonal.

11. The method of claim 7, wherein $\underline{\underline{G}}$ is converted into a system of digital IIR filters (infinite impulse response filter) or into IIR filter having the following form for each channel k:

$$o_k(t_l) = \sum_{q=1}^{K} o_{kq}(t_l) \text{ with}$$

$$o_{pq}(t_l) = \sum_{n=0}^{N} c_{n,pq} i_q(t_{l-n}) - \sum_{n=1}^{N} d_{n,pq} o_{pq}(t_{l-n})$$

wherein l: index of time quantization.

12. The method of claim 7, wherein parameters $a_{n,pq}$, $b_{n,pq}$ are determined as follows:
   a) a first test pulse $i_1^*(t)$ is supplied to a first power supply;
   b) a time behavior of magnetic field components $O_k^*(t)$ (k=1 . . . K) of the K magnetic field coils is measured from a resulting magnetic profile;
   c) entries of a first column of $\underline{\underline{G^{-1}}}$ are determined using a correlation $$\underline{O}^*=\underline{\underline{G^{-1}}}\cdot\underline{I}^*$$

with $\underline{O}^*=(O^*_1,\ldots,O^*_K)$ and $\underline{I}^*=(I^*_1,\ldots,I^*_K)$ wherein $O^*_k(S)$ is the Laplace transform of $o^*_k(t)$ and $I^*_k(s)$ is a Laplace transform of $i^*_k(t)$;
   d) repeating steps a) through c) for channels 2 through K;
   e) determining $\underline{\underline{G}}$ from $\underline{\underline{G^{-1}}}$ through matrix inversion;
   f) determining the parameters $a_{n,pq}$, $b_{n,pq}$ from $\underline{\underline{G}}$ by solving a non-linear compensation problem.

13. The method of claim 12, wherein in step f) comprises at least one of a Gauβ-Newton method and a Levenberg-Marquardt method.

14. A control means for an NMR apparatus the control means being designed to perform the method of claim 1.

15. A controls means for an NMR apparatus designed for performing the method of claim 7.

16. An NMR apparatus comprising a pulse generator means, one or more power supplies and one magnetic field coil for each power supply, wherein the NMR apparatus uses the control means of claim 14 to connect the pulse generator means to the power supply.

17. An NMR apparatus comprising a pulse generator means, one or more power supplies and one magnetic field coil for each power supply, wherein the NMR apparatus uses the control means of claim 15 to connect the pulse generator means to the power supplies.

* * * * *